(12) United States Patent
Hsiao

(10) Patent No.: US 9,497,882 B2
(45) Date of Patent: Nov. 15, 2016

(54) FIXTURE AND SERVER

(71) Applicants: Inventec (Pudong) Technology Corporation, Shanghai (CN); INVENTEC CORPORATION, Taipei (TW)

(72) Inventor: Chia-Liang Hsiao, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 98 days.

(21) Appl. No.: 14/674,970

(22) Filed: Mar. 31, 2015

(65) Prior Publication Data

US 2016/0128222 A1    May 5, 2016

(30) Foreign Application Priority Data

Oct. 30, 2014    (CN) .......................... 2014 1 0603395

(51) Int. Cl.
*H05K 5/00* (2006.01)
*H05K 7/14* (2006.01)

(52) U.S. Cl.
CPC ............ *H05K 7/1487* (2013.01); *H05K 7/142* (2013.01)

(58) Field of Classification Search
CPC ............................ H05K 7/142; H05K 7/1487
See application file for complete search history.

(56) References Cited

U.S. PATENT DOCUMENTS

| 2015/0359146 A1* | 12/2015 | Bailey | H05K 9/0062 174/383 |
| 2016/0081218 A1* | 3/2016 | Fietz | G06F 1/185 361/679.58 |
| 2016/0081219 A1* | 3/2016 | Jau | H05K 7/1487 361/679.02 |
| 2016/0150667 A1* | 5/2016 | Xu | H05K 7/1489 361/679.4 |
| 2016/0165742 A1* | 6/2016 | Shen | H05K 7/1487 361/679.37 |
| 2016/0227657 A1* | 8/2016 | Chen | H05K 7/1487 |

* cited by examiner

*Primary Examiner* — Yuriy Semenenko
(74) *Attorney, Agent, or Firm* — Muncy, Geissler, Olds & Lowe, P.C.

(57) ABSTRACT

A server includes a frame body, a fixed member and a circuit board. The fixed member is fixed on the side of the frame body, and includes a main structure, a stopper, a secure structure and an elastic secure-and-release structure. The main structure is bored with a hole. The stopper is disposed on the side of the main structure. The elastic secure-and-release structure is extended from the main structure to the hole and formed with a protrusion. The circuit board is formed with a notch, a key-shaped hole and a positioning hole. When the circuit board is assembled to the circuit board fixture, the notch is secured by the stopper, the key-shaped hole is provided for the secure structure being inserted therein, and the positioning hole is provided for the protrusion being inserted therein, so as to make the circuit board be fixed.

8 Claims, 7 Drawing Sheets

FIXTURE AND SERVER

FIELD OF THE INVENTION

The present invention is related to a circuit board fixture, and more particularly related to the circuit board fixture for fixing the circuit board by the way of engagement.

BACKGROUND OF THE INVENTION

During the process to assemble the circuit board, it is common to use the accessory tools such as screws and screw drivers to fix the circuit board on the computer frame. The mechanism of screw fixing is quite stable. However, the process is labor consuming and time consuming, which is unfavorable to the assembly of the circuit board.

In addition, as the user wants to disassemble the circuit board, he also needs the assistant of accessory tools and the disassembling process is labor consuming and time consuming.

BRIEF SUMMARY OF INVENTION

In view of the conventional art, as the user wants to assemble or disassemble the circuit board, he usually needs the assistant of accessory tools such as screw drivers to facilitate the assembling or disassembling process. The process is quite labor consuming and time consuming, and thus the labor cost would be increased.

Accordingly, it is a main object of the present invention to provide a circuit board fixture, which features a fixed member with a stopper, a secure structure and an elastic secure-and-release structure to fix the circuit board.

As mentioned, a circuit board fixture is provided in accordance the present invention. The circuit board fixture is utilized for fixing a circuit board, which includes a notch, a key-shaped hole, and a positioning hole. The circuit board fixture includes a frame body and a fixed member. The fixed member is fixed on a side of the frame body, and includes a main structure, a stopper, a secure structure, and an elastic secure-and-release structure. The main structure has a hole. The stopper is disposed on a side of the main structure for engaging with the notch. The secure structure is disposed on another side of the main structure, which is opposite to the side with the stopper, for engaging with the key-shaped hole. The elastic secure-and-release structure is integrally connected to the main structure and extended from the main structure to the hole, and the elastic secure-and-release structure has a protrusion corresponding to the positioning hole. Wherein, after the circuit board is disposed on the frame body by aligning the key-shaped hole to the secure structure, the circuit board is moved along an assembling direction to release the protrusion so as to have the protrusion secured by the positioning hole, to have the notch engaged with the stopper, and to have the key-shaped hole engaged with the secure structure.

As mentioned, because the circuit board is secured by using the stopper and the secure structure and is fixed through the engagement with the elastic secure-and-release structure in accordance with the present invention, the circuit board can be assembled without using the accessory tools, and thus, the assembling process would be more efficient and both the consumption of labor and time can be reduced.

In accordance with an embodiment of the present invention mentioned above, the stopper further includes a first stopping part to against the circuit board.

In accordance with an embodiment of the present invention mentioned above, the secure structure further includes a first stopping part to against the circuit board.

In accordance with an embodiment of the present invention mentioned above, the circuit board further includes a groove, and the elastic secure-and-release structure is correspondingly exposed from the groove.

A server is also provided in accordance the present invention. The server includes a frame body, a fixed member, and a circuit board.

The fixed member is fixed on a side of the frame body, and includes a main structure, a stopper, a secure structure, and an elastic secure-and-release structure. The main structure has a hole. The stopper is disposed on a side of the main structure. The secure structure is disposed on another side of the main structure, which is opposite to the side with the stopper. The elastic secure-and-release structure is integrally connected to the main structure and extended from the main structure to the hole, and the elastic secure-and-release structure has a protrusion. The circuit board includes a notch, a key-shaped hole, and a positioning hole. The notch is utilized for engaging with the stopper. The key-shaped hole is utilized for engaging with the secure structure. The positioning hole is corresponding to the protrusion. Wherein, after the circuit board is disposed on the frame body by aligning the key-shaped hole to the secure structure, the circuit board is moved along an assembling direction to release the protrusion so as to have the protrusion secured by the positioning hole, to have the notch engaged with the stopper, and to have the key-shaped hole engaged with the secure structure.

In accordance with an embodiment of the present invention mentioned above, the stopper further includes a first stopping part to against the circuit board.

In accordance with an embodiment of the present invention mentioned above, the secure structure further includes a first stopping part to against the circuit board.

In accordance with an embodiment of the present invention mentioned above, the circuit board further includes a groove, and the elastic secure-and-release structure is correspondingly exposed from the groove.

The embodiments adopted in the present invention would be further discussed by using the flowing paragraph and the figures for a better understanding.

DETAILED DESCRIPTION OF THE INVENTION

Figure 1:
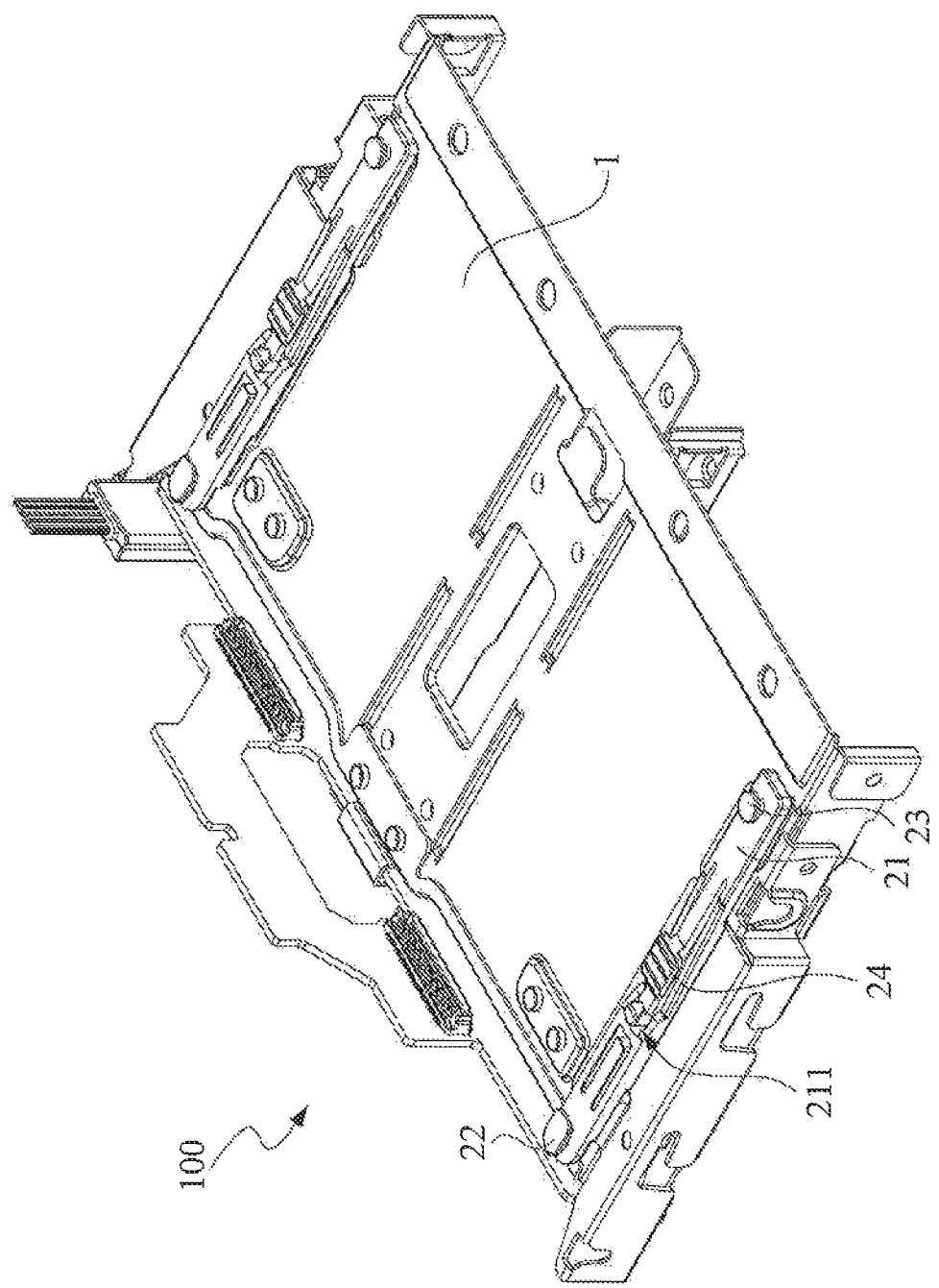
FIG. 1 is a 3D schematic view showing the frame body and the fixed member of the circuit board fixture in accordance with a preferred embodiment of the present invention.
Figure 2:
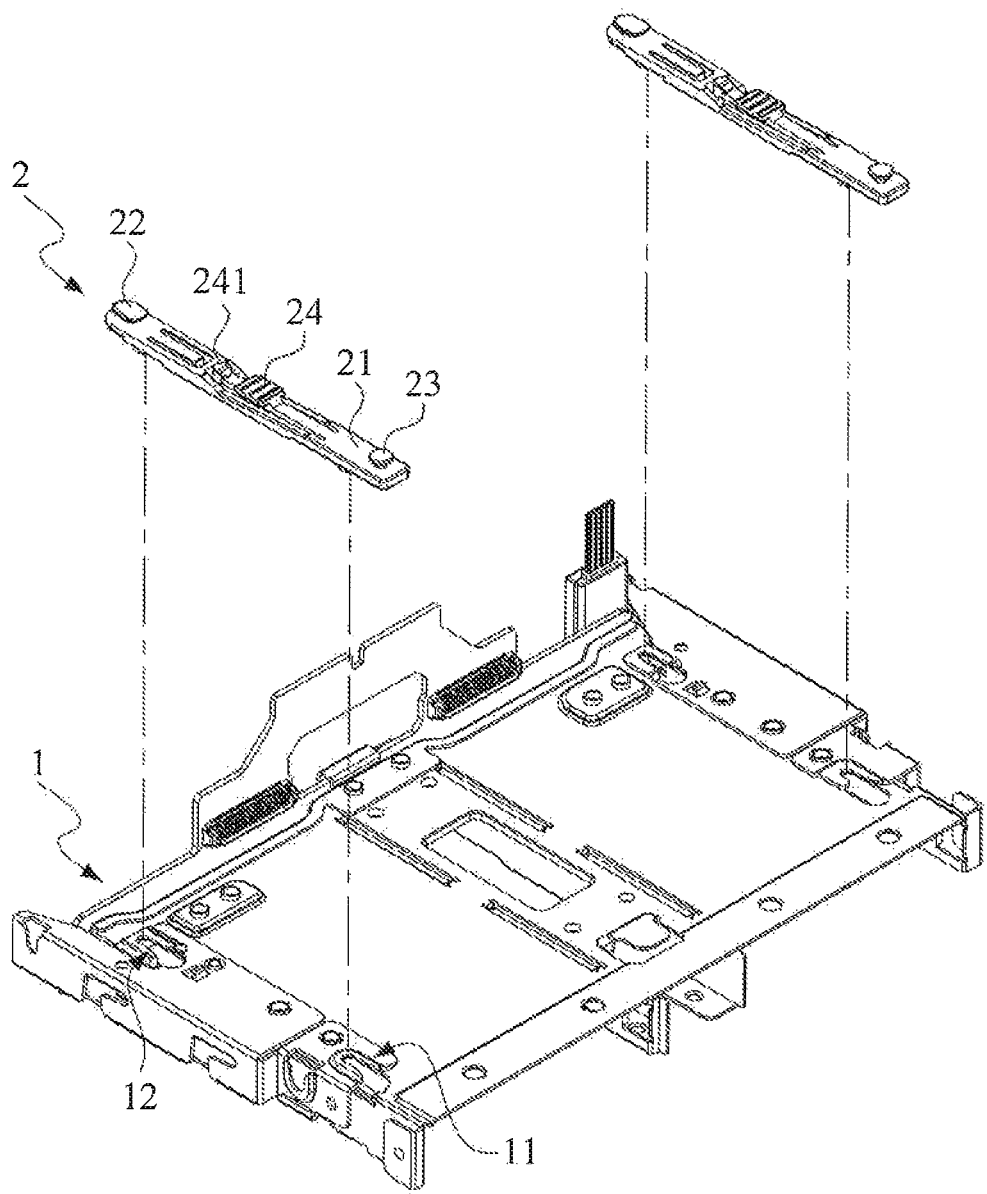
FIG. 2 is an explosive view showing the frame body and the fixed member of the circuit board fixture in accordance with a preferred embodiment of the present invention.

Please refer to FIG. 1 and FIG. 2, wherein FIG. 1 is a 3D schematic view showing the frame body and the fixed member of the circuit board fixture in accordance with a preferred embodiment of the present invention and FIG. 2 is an explosive view showing the frame body and the fixed member of the circuit board fixture in accordance with a preferred embodiment of the present invention. As shown, a circuit board fixture 100 includes a frame body 1, and two fixed members 2. The two fixed members (only one of them is labeled) are disposed on the opposite sides of the frame body 1. The frame body 1 has a first fixing part 11 and a second fixing part 12 on the two sides of the frame body 1 for engaging with and fixing the fixed members 2. Each of the fixed members 2 includes a main structure 21, a stopper 22, a secure structure 23, and an elastic secure-and-release structure 24. The main structure 21 has an hole 211.

The stopper 22 is disposed on a side of the main structure 21, and has a first stopping part 221. The secure structure 23 is disposed on another side of the main structure 21, which is opposite to the side with the stopper 22, and has a second stopping part 231.

The elastic secure-and-release structure 24 is integrally formed on and connected to the main structure 21 and is extended from the main structure 21 to the hole 211. The elastic secure-and-release structure 24 also has a protrusion 241.

Figure 3:
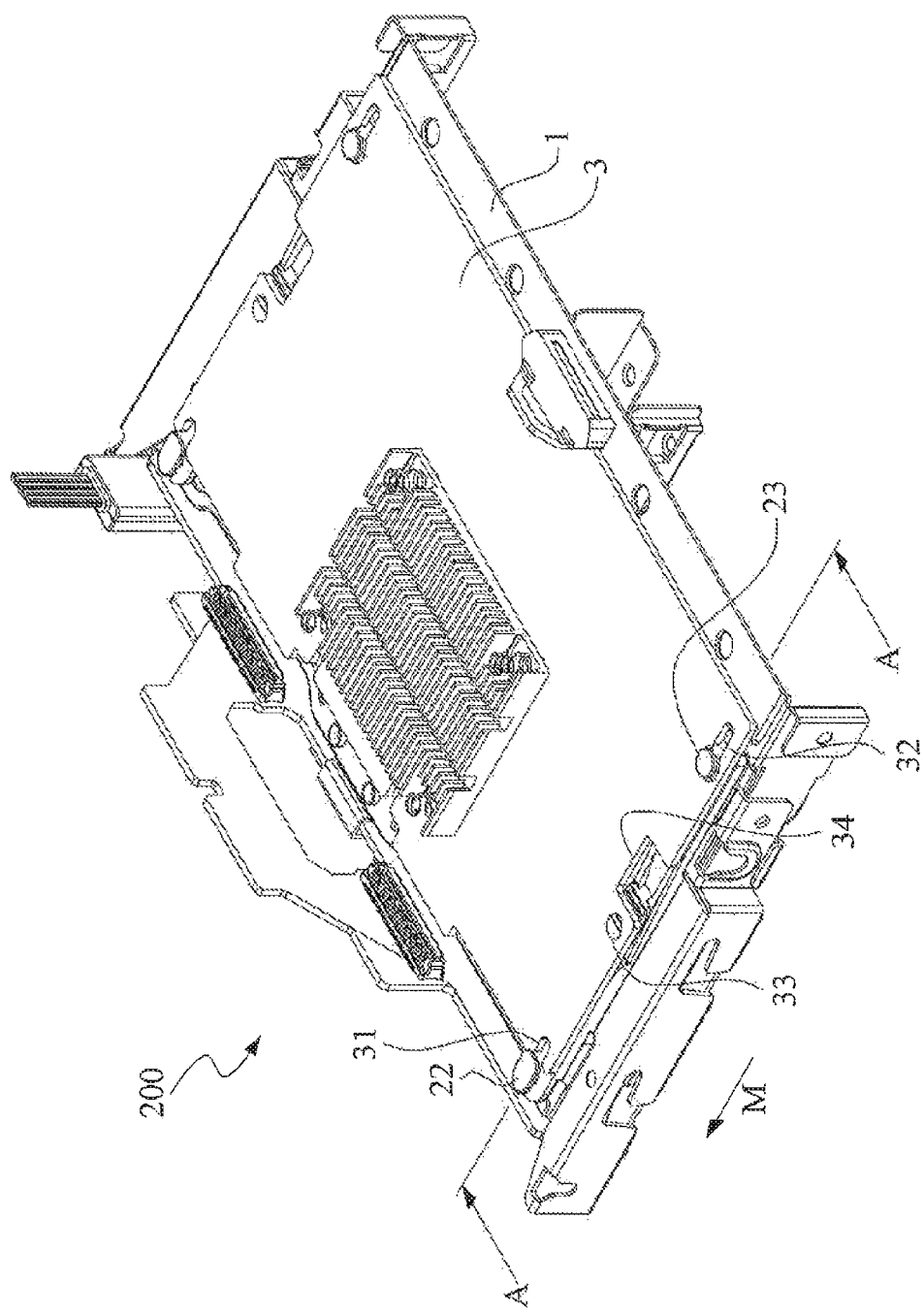
FIG. 3 is a 3D schematic view showing the server provided in accordance with a preferred embodiment of the present invention.
Figure 4:
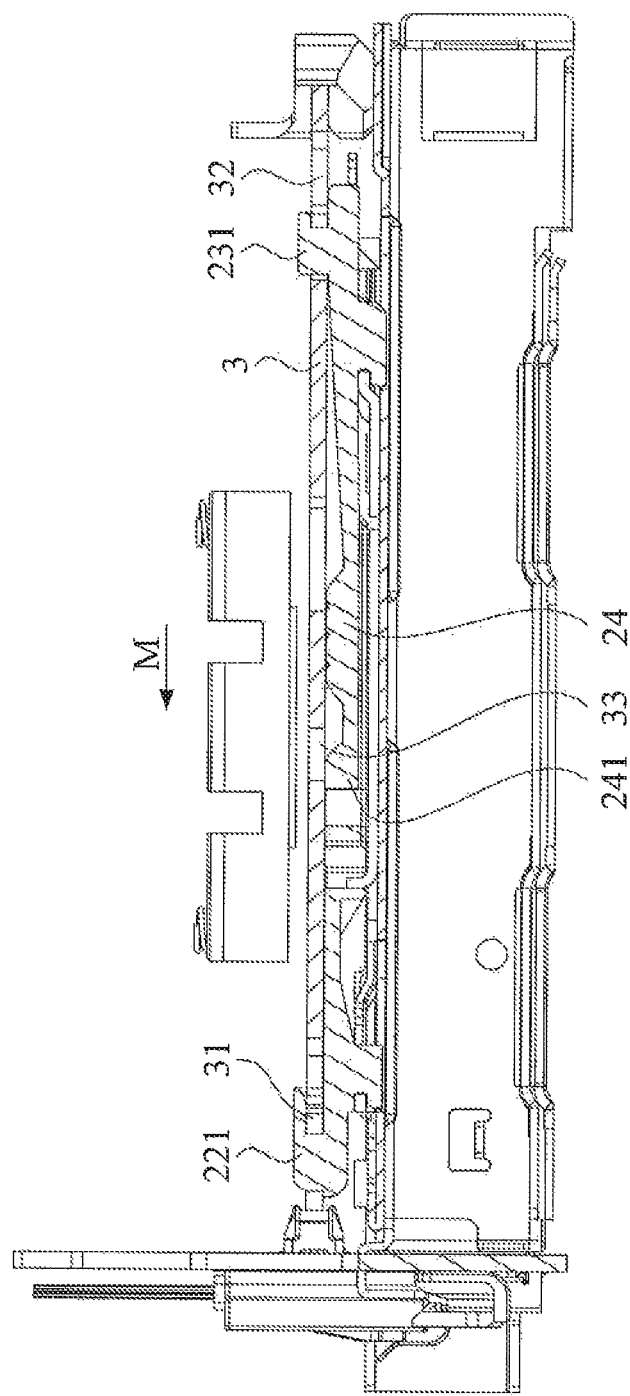
FIG. 4 is a schematic cross-section view along cross-section line A-A of FIG. 3.
Figure 5:
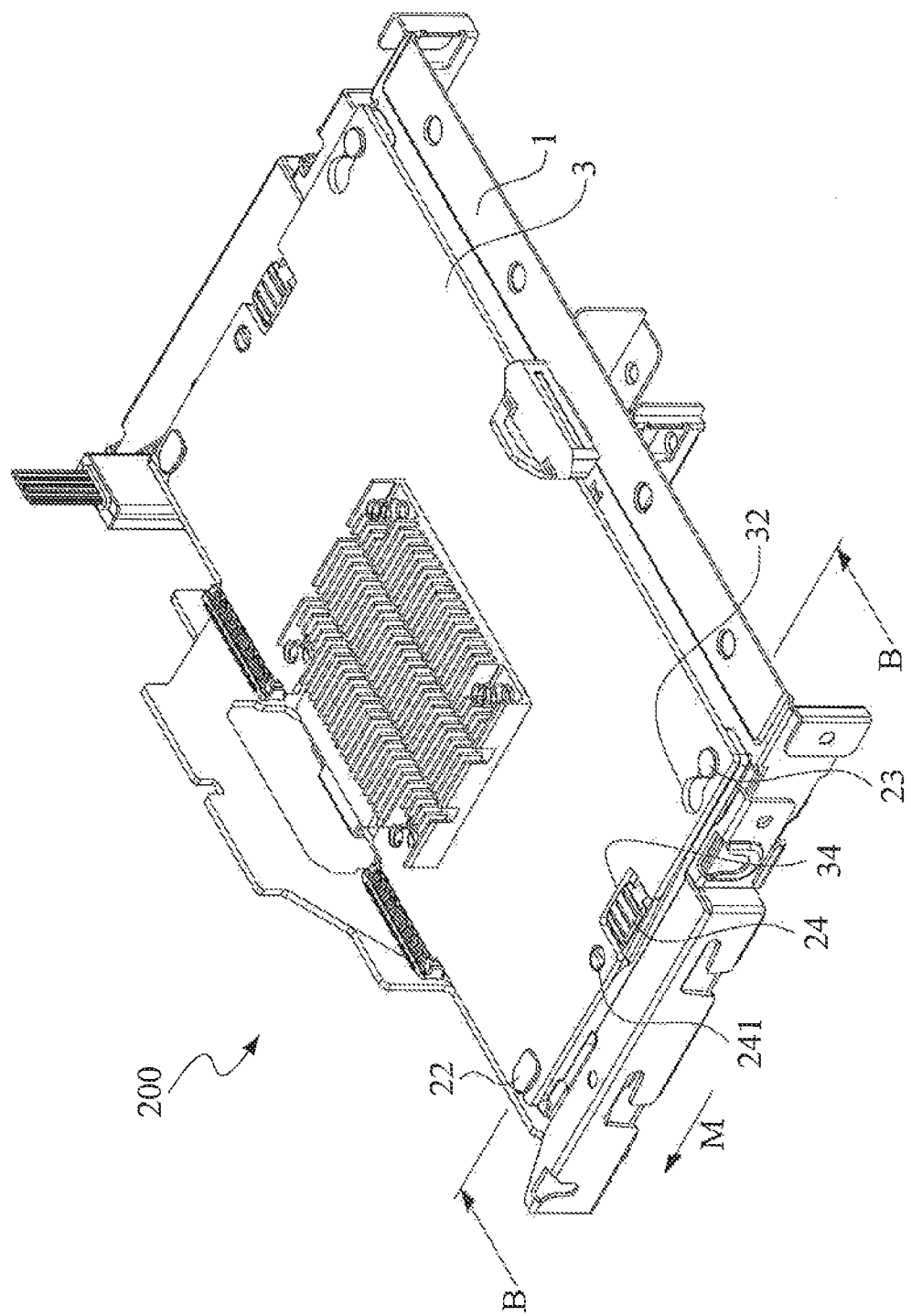
FIG. 5 is an explosive view showing the circuit board of the server moving along the assembling direction and fixed by the fixture in accordance with an embodiment of the present invention.
Figure 6:
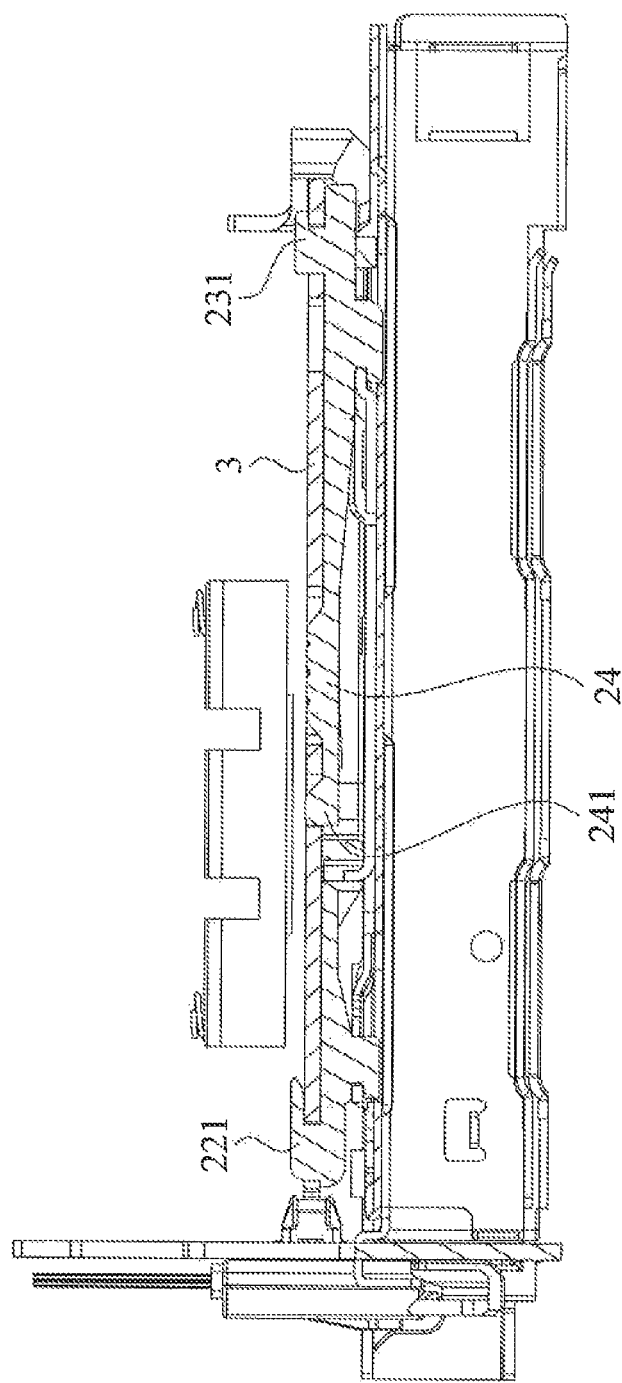
FIG. 6 is a schematic cross-section view along cross-section line B-B of FIG. 5.

Please refer to FIG. 3 to FIG. 6, wherein FIG. 3 is a 3D schematic view showing the server provided in accordance with a preferred embodiment of the present invention, FIG. 4 is a schematic cross-section view along the cross-section line A-A of FIG. 3, FIG. 5 is an explosive view showing the circuit board of the server which moved along the assembling direction and fixed by the fixture in accordance with an embodiment of the present invention, and FIG. 6 is a schematic cross-section view along the cross-section line B-B of FIG. 5.

As shown, in addition to the frame body 1 and the fixed member 2 mentioned above, the server 200 also includes a circuit board 3. The circuit board 3 includes a notch 31, a key-shaped hole 32, a positioning hole 33 and a groove 34. The notch 31 is utilized for engaging with the stopper 22. The key-shaped hole 32 is utilized for engaging with the secure structure 23. The positioning hole 33 is utilized for engaging with the protrusion 241. The groove 34 is corresponding to the elastic secure-and-release structure 24.

In practical application, firstly, the user aligns the key-shaped hole 32 of the circuit board 3 to the secure structure 23 and aligns the notch 31 to the stopper 22 so as to have circuit board 3 disposed on the frame body 1, then, the user moves the circuit board 3 along an assembling direction M to have the notch 31 secured by the stopper 22 and have the key-shaped hole 32 engaged with the secure structure 23. As the circuit board 3 is moved to a position that the protrusion 241 aligns to the positioning hole 33, the protrusion 241 would be bounced (or released) and secured by the positioning hole 33 to have the circuit board 3 steadily assembled on the frame body 1. Meanwhile, the elastic secure-and-release structure 24 would be exposed from the groove 34 in response. It is noted that at the time the circuit board 3 is disposed on the frame body 1, the elastic secure-and-release structure 24 would be pressed down by the circuit board 3 such that as the circuit board 3 is moved along the assembling direction M to the position that the protrusion 241 aligns to the positioning hole 33, the elastic secure-and-release structure 24 would be bounced back to lock the circuit board 3.

In addition, as the user wants to disassemble the circuit board 3 from the frame body 1, what he needs to do is to simultaneously press the elastic secure-and-release structures 24 of the fixed members 2 on the both sides of the frame body 1 to have the protrusion 241 leaving the positioning hole 33, and then move the circuit board 3 along a direction reverse to the assembling direction M to release the stopper 22 and the secure structure 23 from the notch 31 and the key-shaped hole 32 to escape the engagement such that the circuit board 3 can be removed from the frame body 1.

Figure 7:
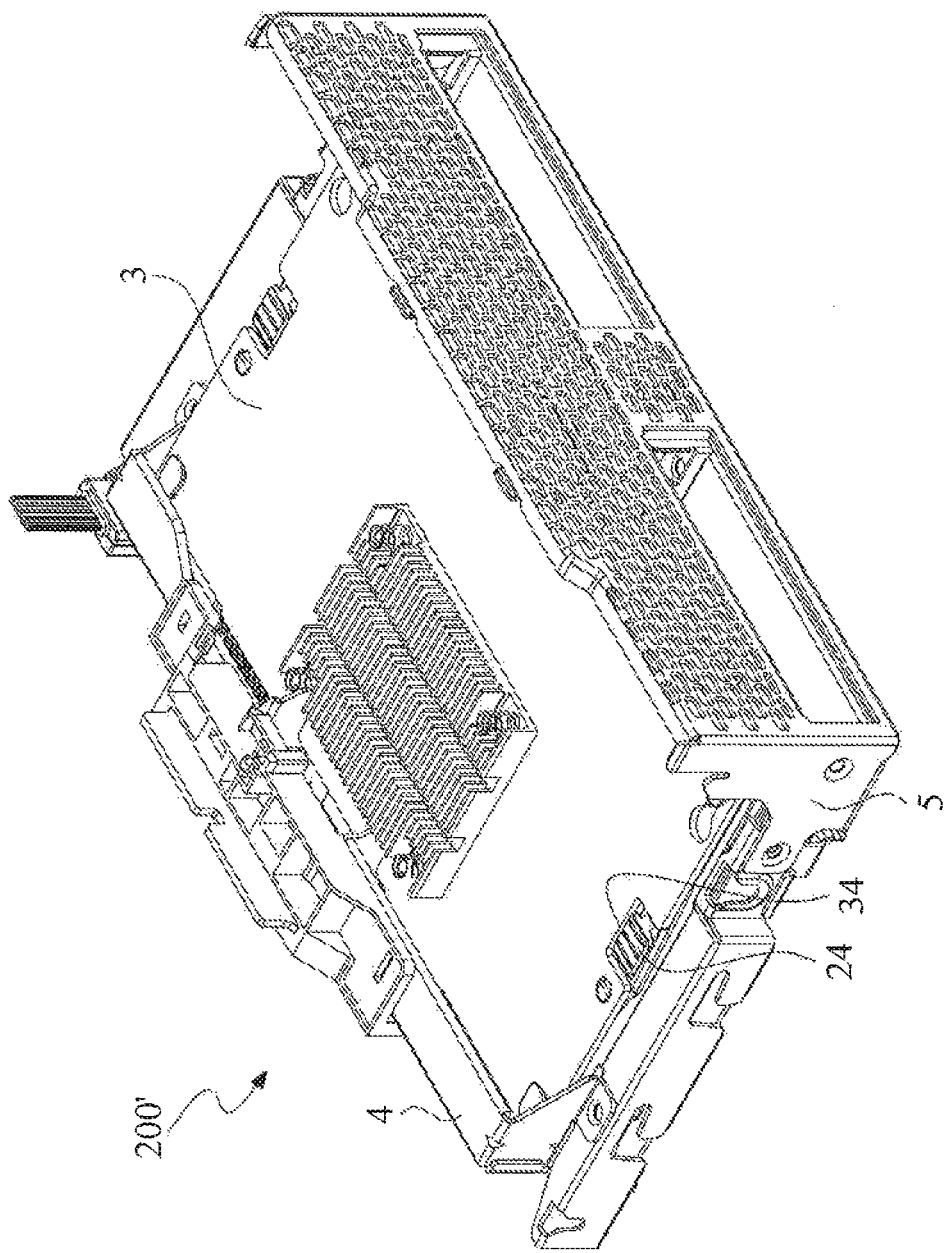
FIG. 7 is a 3D schematic view showing the practice of the server in accordance with a preferred embodiment of the present invention.

Please refer to FIG. 1 to FIG. 7, wherein FIG. 7 is a 3D schematic view showing the practical application of the server in accordance with a preferred embodiment of the present invention. As shown, in compared with the above mentioned server 200, the server 200' in practice also has a side board fixing structure 4 and a side frame 5. Although the side board fixing structure 4 and the side frame 5 are formed on the circuit board fixture 100' for fixing the circuit board 3, the side board fixing structure 4 and the frame 5 would not interfere the assembling process because during the assembling process, the circuit board 3 is disposed on the frame body 1 along a vertical direction in front.

In conclusion, because the circuit board fixture provided in accordance with the present invention has the feature of using the stopper and the secure structure of the fixed member to engage with the notch and the key-shaped hole of the circuit board such that the circuit board can be secured by and fixed on the frame body by the way of sliding. In addition, the present invention also adopts the elastic secure-and-release structure to engage with the positioning hole to have the circuit board secured on the frame body more stable. In compared with the assembling process of the conventional art, in which the circuit board is fixed by the way of screw-fixing, in the assembling process provided in accordance with the present invention, the user just needs to slide the circuit board on the frame body to secure the circuit board, and in the disassembling process, the user just needs to press the elastic secure-and-release structure to remove the circuit board. Thus, time consumption of both assembling and dissembling processes can be significantly reduced and the assembling convenience can be enhanced.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

We claim:

1. A circuit board fixture, utilized for fixing a circuit board formed with a notch, a key-shaped hole, and a positioning hole, and the circuit board fixture comprising:
   a frame body; and
   a fixed member, fixed on a side of the frame body, and including:
      a main structure, having a hole;

a stopper, disposed on a side of the main structure, and utilized for engaging with the notch;

a secure structure, disposed on another side of the main structure, which is opposite to the side with the stopper, and utilized for engaging with the key-shaped hole; and an elastic secure-and-release structure, integrally connected to the main structure and extended from the main structure to the hole, and the elastic secure-and-release structure having a protrusion corresponding to the positioning hole;

wherein, after the circuit board is disposed on the frame body by aligning the key-shaped hole to the secure structure, the circuit board is moved along an assembling direction to release the protrusion and have the protrusion secured by the positioning hole, to have the notch engaged with the stopper, and to have the key-shaped hole engaged with the secure structure.

2. The circuit board fixture of claim 1, wherein the stopper further comprises a first stopping part to against the circuit board.

3. The circuit board fixture of claim 1, wherein the secure structure further comprises a second stopping part to against the circuit board.

4. The circuit fixture of claim 1, wherein the circuit board further comprises a groove, and the elastic secure-and-release structure is correspondingly exposed from the groove.

5. A server, comprising:
a frame body;
a fixed member, fixed on a side of the frame body, and including:
  a main structure, having a hole;
  a stopper, disposed on a side of the main structure;
  a secure structure, disposed on another side of the main structure, which is opposite to the side with the stopper;
  an elastic secure-and-release structure, integrally connected to the main structure and extended from the main structure to the hole, and the elastic secure-and-release structure having a protrusion; and
a circuit board, including:
  a notch, utilized for engaging with the stopper;
  a key-shaped hole, utilized for engaging with the secure structure; and
  a positioning hole, corresponding to the protrusion;
wherein, after the circuit board is disposed on the frame body by aligning the key-shaped hole to the secure structure, the circuit board is moved along an assembling direction to release the protrusion and have the protrusion secured by the positioning hole, to have the notch engaged with the stopper, and to have the key-shaped hole engaged with the secure structure.

6. The server of claim 5, wherein the stopper further comprises a first stopping part to against the circuit board.

7. The server of claim 5, wherein the stopper further comprises a first stopping part to against the circuit board.

8. The server of claim 5, wherein the circuit board further comprises a groove, and the elastic secure-and-release structure is correspondingly exposed from the groove.

* * * * *